(12) United States Patent
Bedeschi et al.

(10) Patent No.: US 9,196,359 B2
(45) Date of Patent: *Nov. 24, 2015

(54) READ DISTRIBUTION MANAGEMENT FOR PHASE CHANGE MEMORY

(71) Applicant: Micron Technology, Inc., Boise, ID (US)

(72) Inventors: Ferdinando Bedeschi, Biassono (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/571,137

(22) Filed: Dec. 15, 2014

(65) Prior Publication Data

US 2015/0098269 A1    Apr. 9, 2015

Related U.S. Application Data

(63) Continuation of application No. 13/913,714, filed on Jun. 10, 2013, now Pat. No. 8,913,426, which is a continuation of application No. 12/905,754, filed on Oct. 15, 2010, now Pat. No. 8,467,237.

(51) Int. Cl.
*G11C 13/00* (2006.01)
*G11C 11/56* (2006.01)

(52) U.S. Cl.
CPC .......... *G11C 13/004* (2013.01); *G11C 11/5678* (2013.01); *G11C 13/0004* (2013.01); *G11C 13/0035* (2013.01); *G11C 13/0064* (2013.01); *G11C 13/0069* (2013.01); *G11C 2013/0054* (2013.01); *G11C 2211/5634* (2013.01); *G11C 2213/54* (2013.01)

(58) Field of Classification Search
CPC .......... G11C 13/0004; G11C 11/5678; G11C 13/0007; G11C 13/0069
USPC ..................... 365/163, 189.07, 148
See application file for complete search history.

(56) References Cited

U.S. PATENT DOCUMENTS

| | | |
|---|---|---|
| 6,868,025 B2 | 3/2005 | Hsu |
| 7,495,944 B2 | 2/2009 | Parkinson et al. |
| 7,554,861 B2 | 6/2009 | Vimercati et al. |
| 7,701,765 B2 | 4/2010 | Aritome |
| 7,952,922 B2 | 5/2011 | Aritome |

(Continued)

FOREIGN PATENT DOCUMENTS

| | | |
|---|---|---|
| CN | 101471130 | 7/2009 |
| CN | 101699562 | 4/2010 |

(Continued)

OTHER PUBLICATIONS

Application titled "Encoding Program Bits to Decouple Adjacent Wordlines in a Memory Device," U.S. Appl. No. 13/435,243, filed Mar. 30, 2012.

(Continued)

*Primary Examiner* — Hoai V Ho
*Assistant Examiner* — Tri Hoang
(74) *Attorney, Agent, or Firm* — Knobbe, Martens, Olson & Bear, LLP (57) ABSTRACT

Subject matter disclosed herein relates to a memory device, and more particularly to write performance of a phase change memory.

21 Claims, 5 Drawing Sheets

(56) References Cited

U.S. PATENT DOCUMENTS

| | | | |
|---|---|---|---|
| 8,031,526 B1 | 10/2011 | Wu et al. | |
| 8,040,723 B2 * | 10/2011 | Sheu et al. | 365/163 |
| 8,050,086 B2 | 11/2011 | Shalvi et al. | |
| 8,144,505 B2 | 3/2012 | Lee | |
| 8,159,869 B2 * | 4/2012 | Park et al. | 365/163 |
| 8,169,825 B1 | 5/2012 | Shalvi et al. | |
| 8,228,701 B2 | 7/2012 | Sokolov et al. | |
| 8,238,157 B1 | 8/2012 | Sommer et al. | |
| 8,300,478 B2 | 10/2012 | Shalvi et al. | |
| 8,335,107 B2 | 12/2012 | Lee | |
| 8,369,147 B2 | 2/2013 | Aritome | |
| 8,391,062 B2 | 3/2013 | Jang | |
| 8,437,185 B2 | 5/2013 | Shalvi et al. | |
| 8,462,548 B2 | 6/2013 | Aritome | |
| 8,570,804 B2 | 10/2013 | Shalvi et al. | |
| 8,593,873 B2 | 11/2013 | Cerafogli et al. | |
| 8,910,000 B2 | 12/2014 | Bedeschi | |
| 9,001,575 B2 | 4/2015 | Bedeschi | |
| 2004/0225705 A1 | 11/2004 | Rumynin | |
| 2006/0123288 A1 | 6/2006 | Luk | |
| 2008/0084773 A1 | 4/2008 | Madan et al. | |
| 2008/0158948 A1 | 7/2008 | Sharon et al. | |
| 2009/0016100 A1 | 1/2009 | Jeong | |
| 2009/0237977 A1 * | 9/2009 | Ramani et al. | 365/148 |
| 2010/0020615 A1 | 1/2010 | Miwa et al. | |
| 2010/0067286 A1 * | 3/2010 | Taylor et al. | 365/163 |
| 2010/0165725 A1 | 7/2010 | Bedeschi | |
| 2010/0265764 A1 | 10/2010 | Yoo et al. | |
| 2012/0127801 A1 | 5/2012 | Kim | |
| 2012/0195118 A1 | 8/2012 | Yang | |
| 2012/0262970 A1 | 10/2012 | Sokolov et al. | |
| 2012/0262971 A1 | 10/2012 | Sokolov et al. | |
| 2012/0268890 A1 | 10/2012 | Stock et al. | |
| 2012/0290897 A1 | 11/2012 | Yoon et al. | |
| 2013/0007353 A1 | 1/2013 | Shim et al. | |
| 2013/0141972 A1 | 6/2013 | Yoon et al. | |
| 2013/0141974 A1 | 6/2013 | Jang | |
| 2013/0167251 A1 | 6/2013 | Pio | |
| 2013/0182510 A1 | 7/2013 | Tanzawa | |
| 2013/0235665 A1 | 9/2013 | Khaef | |
| 2013/0262743 A1 | 10/2013 | Bedeschi | |
| 2013/0279260 A1 | 10/2013 | Yoon et al. | |
| 2013/0290604 A1 | 10/2013 | Bedeschi | |
| 2015/0095560 A1 | 4/2015 | Bedeschi | |

FOREIGN PATENT DOCUMENTS

| | | |
|---|---|---|
| JP | 2004-273110 | 9/2004 |
| KR | 10-2009-0006631 | 1/2009 |
| WO | WO2008/085254 | 7/2008 |

OTHER PUBLICATIONS

Application titled, "Program-Disturb Decoupling for Adjacent Wordlines of a Memory Device," U.S. Appl. No. 13/457,799, filed Apr. 27, 2012.

Korean Preliminary Rejection dated Jan. 25, 2013 in corresponding Korean Appl. No. 10-2011-105088, filed Oct. 14, 2011, 10 pages.

Japanese Notice of Rejection Grounds dated Feb. 5, 2013 in corresponding Japanese Appl. No. 2011-203372, filed Sep. 16, 2011, 9 pages.

First Office Action dated Nov. 5, 2013 in corresponding Chinese Appl. No. 201110317448.2, filed Oct. 12, 2011, 9 pages.

Office Action dated Sep. 23, 2014 in corresponding Taiwan Appl. No. 100131966, filed Sep. 5, 2011, 12 pages.

* cited by examiner

READ DISTRIBUTION MANAGEMENT FOR PHASE CHANGE MEMORY

REFERENCE TO RELATED APPLICATIONS

The entireties of any and all applications for which a foreign or domestic priority claim is identified in the Application Data Sheet as filed with the present application are hereby incorporated by reference under 37 CFR 1.57.

BACKGROUND

1. Field

Subject matter disclosed herein relates to a memory device, and more particularly to read/write performance of phase change memory.

2. Information

Phase change memory (PCM) may operate based, at least in part, on behavior and properties of one or more particular phase change materials, such as chalcogenide alloy and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

A PCM memory cell may transition from an amorphous state to a crystalline state by applying a bias signal to the memory cell. Characteristics of a bias signal, such as peak magnitude and/or pulse width, for example, may be selected to allow a transition to a crystalline state.

Over time, various parameters of a PCM memory cell, such as read current for particular memory cell states, may drift or change as a result of changing PCM temperature, re-crystallization of phase change material, drift, and/or cycling, just to name a few examples. Such effects may lead to read errors of the PCM memory cell.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving managing read distributions for single-level cell (SLC) or multi-level cell (MLC) phase change memory (PCM) devices. Managing read distributions of PCM cells may be used to avoid read errors in response to a shift in a state distribution of the PCM cells that may occur over time, as described below. A state distribution of a memory cell, for example, may correspond to one or more threshold voltages corresponding to a number of states or logic levels stored by the memory cell. In other words, such states or logic levels may correspond to voltage ranges separated by threshold voltages. For example, a first logic level may correspond to a first voltage range, a second logic level may correspond to a second voltage range, a third logic level may correspond to a third voltage range, and so on. Individual logic levels may correspond to two-bit data, such as "00" for a first logic level, "01" for a second logic level, "10" for a third logic level, and "11" for a fourth logic level, for example.

In an embodiment, a method of reading a memory cell programmed at a particular current may include compensating for a change in the particular current. Such a change, for example, may result from changes in various physical phenomena, such as resistivity drift of PCM material, temperature changes, retention, and so on, as described in detail below. Such a change in current may occur during a time span prior to reading the memory cell. In one implementation, such current compensation may be performed for each of one or more steps of an applied current staircase, as described in detail below.

Such a method of reading a memory cell may include a process of programming one or more reference cells into a set of different known states (e.g., current levels) at the same time that an array of memory cells (e.g., of a page of memory) is being written. Such a process may provide an opportunity to verify and/or determine, subsequent to programming the one or more reference cells, change or shift of the reference cells with respect to the original state in which the reference cell were programmed. Such verification and/or determination may be performed during a read operation of a memory cell. Information regarding change or shift of current values, for example, of the reference cells may be stored in a look-up table, as described in detail below.

In an embodiment, a method of reading a memory cell may include forcing current into a reference cell to determine a resulting voltage drop through the reference cell itself. Such a resulting voltage drop may be compared with a voltage drop resulting from current flowing into a particular memory cell of an array. If such a comparison indicates that the two voltages are substantially equal (e.g., a value of current flowing through the particular memory cell being the same as the current flowing through the reference cell of the array), then the particular memory cell may be considered to be within a particular range or distribution of the reference current. Due to environmental changes, process changes, and so on, a present value of current in the particular memory cell may have drifted from that of the original state at the time the particular reference cell was programmed. Accordingly, differences between original values of individual currents in a distribution and present values of individual currents in the distribution may be estimated and such difference values may be stored in a register, for example. To compensate for variations of current that may have occurred during a span of time, appropriate current differences may be retrieved from the register and applied to current in a memory cell.

In an implementation, compensating for a change in a particular current of a memory cell, as described above, may be performed in response to an error correction code (ECC) overflow event. For example, an ECC circuit may be designed for a particular capability to correct a number of errors in data. If the number of errors detected exceeds such a capability, the circuit may experience an ECC overflow event, wherein such errors in the data may not be corrected.

In an embodiment, PCM cells may be programmed with any one of two or more logic levels based, at least in part, on one or more threshold reference voltages or threshold reference currents that separate the two or more states or logic levels. Accordingly, logic levels stored in PCM cells may be subsequently read and determined based, at least in part, on the same one or more threshold reference currents used to previously program the PCM cells. In particular, verify reference currents may be used as thresholds to which a cell current during a read process of a PCM cell is compared. A cell current during a read process may result by applying a voltage across a PCM cell so that the cell current during the read process may depend, at least in part, on a resistance of the PCM cell. Accordingly, the state or logic value of a PCM cell, e.g., level of resistance, may be determined by comparing such a cell current during the read process to threshold reference currents. Over time, however, cell current for a particular voltage applied across a PCM cell may drift or change due to temperature changes of the PCM cell, for example (other reasons for such drift will be discussed below). Herein, drift of PCM cell parameters leading to such changes in cell current for a particular applied voltage may be referred to as state distribution drift. Because cell currents corresponding to stored logic levels may vary over time while threshold reference currents remain unchanged, a comparison of the cell and reference currents may lead to misreading of logic levels stored in the memory cells.

In an embodiment, an apparatus may comprise a memory device such as a program buffer that includes a PCM array and reference cells comprising a portion of the PCM array to store particular reference states. The reference cells and the PCM array may be programmed at the same time. In such a case, influences, such as temperature for example, on the PCM cells may affect stored reference states and stored memory states identically, possibly resulting in a drift and/or change in distribution of such states, as explained in further detail below. Such an apparatus may also comprise a controller to apply a particular voltage across a cell of the PCM array to produce a read current, and to modify the cell current based, at least in part, on a reference current resulting from at least one of the reference cells. In an implementation, an amount of state distribution drift of a reference cell at a particular time may be determined so that a read current of a PCM cell may be modified accordingly during a process to read the PCM cell. Accordingly, read errors resulting from state distribution drift of PCM cells may be reduced by modifying PCM cell read current during a read process. Determining an amount of state distribution drift may be made by comparing a read current of a reference cell at a particular time with a read current of the reference cell at an earlier time. Results of such a determination may be stored as a value of the current difference between the reference cell read currents at the different times. Such a current difference is herein called a "current delta". Current deltas may be determined in such a fashion for one or more read currents, as discussed below. Subsequently, a read current of a PCM cell may then be modified during a process to read the PCM cell of the PCM array based, at least in part, on such current deltas.

Further, during such a read process to scan for a stored state, read current of a PCM cell may be incrementally increased by applying an incrementally increasing voltage across the PCM cell. In a particular implementation, incrementally increasing voltage (and the resulting cell current) may be performed in steps that are herein labeled with "N", as described below. Accordingly, read current of a memory cell may be modified by particular amounts for individual read current steps N, thus taking into account the fact that state distribution drift may affect a memory cell differently for different cell voltages (and resulting read currents). For example, during such current stepping, a determination may be made for individual increment steps N as to whether or not to modify a read current. Such a determination may be based, at least in part, on a look-up table populated with current deltas corresponding to individual increment steps N. In one particular implementation, nonvolatile memory may be used to store current deltas as a function of N, for example.

Figure 1:
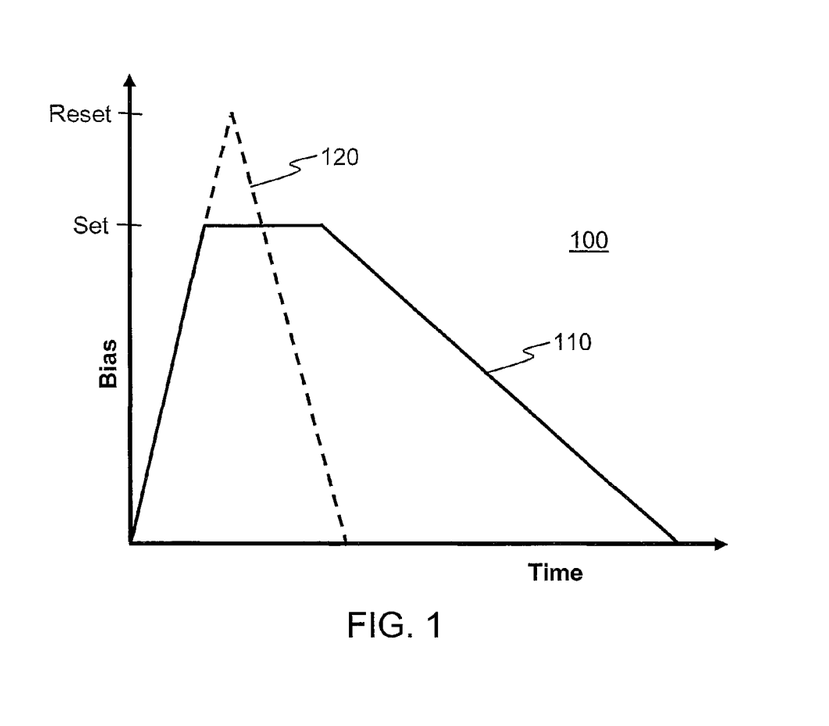
FIG. 1 is a plot of characteristics of bias signal waveforms, according to an embodiment.

FIG. 1 is a plot 100 of characteristics of bias signal waveforms, according to an embodiment. A PCM cell may be reset by melting phase change material by applying a relatively high amplitude, relatively short duration electrical programming pulse, or bias signal 120. In a reset state, an active region of phase change material may comprise an amorphous region that is dome-shaped, disposed adjacent to a heater element in a PCM cell, for example. Crystallized phase change material may surround such an amorphous region. In such a state, a PCM cell may have a relatively high electrical resistance. In a subsequent process, a PCM cell may be set by crystallizing a dome-shaped amorphous region so that a substantially entire region of phase change material may be crystalline. Such a process may involve ramping down a voltage and/or current of relatively low amplitude, relatively long duration bias signal 110 applied to a PCM cell to crystallize its phase change material. In such a state, a PCM cell may have a relatively low electrical resistance. In a particular implementation, such as for a MLC, a particular bias signal 120 may be selected to set a PCM cell to a particular state corresponding to a particular range of resistances. For example, bias signal 120 may be decreased in duration and/or amplitude.

Figure 2:
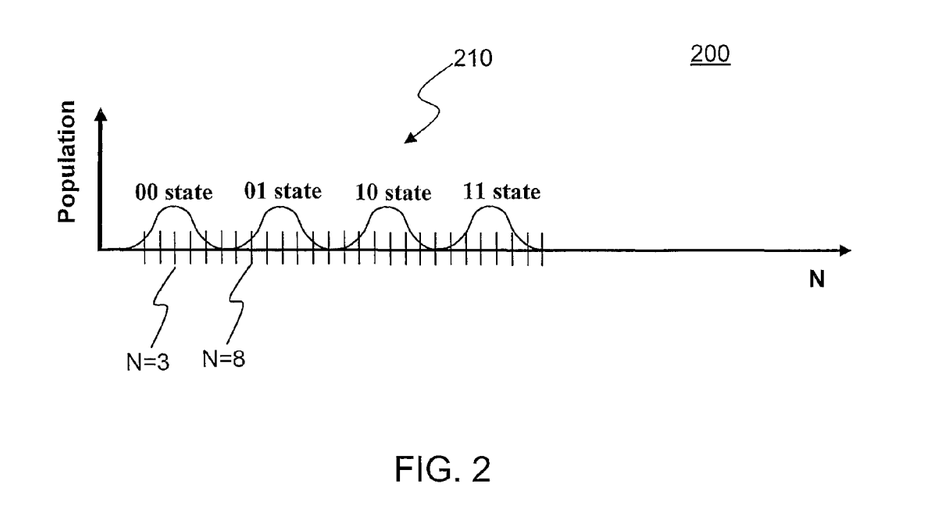
FIG. 2 is a plot showing a distribution of states of memory cells in a PCM, according to an embodiment.

FIG. 2 is a plot 200 showing a distribution of states 210 of memory cells in a PCM plotted against read-current step number N, according to an embodiment. In particular, such memory cells may comprise multi-level cells. Individual read-current step numbers N, shown by the horizontal axis, may correspond to particular read currents. As mentioned above, read-currents may be incremented through a range that encompasses multiple states of an MLC. For example, N=1 may correspond to a read current of one micro-amp, N=2 may correspond to a read current of two micro-amps, and so on. Continuing with the example, a relatively large population of memory cells of the PCM of plot 200 may have a "00" state corresponding to a read current of three micro-amps or N=3, a "01" state corresponding to a read current of ten micro-amps or N=10, and so on. A smaller population of memory cells, however, may have states that fall on the "tails" of read-current distributions. For example, some memory cells of the PCM of plot 200 may have a "00" state corresponding to a read current of two micro-amps or N=2, a "01" state corresponding to a read current of eight micro-amps or N=8, and so on. Thus, in an implementation, read currents may be scanned from a relatively low value (e.g., N=0) to a relatively high value (e.g., N=24) in order to account for variations of read currents for multiple states of a population of memory cells. In addition to such a statistical variation over a population of memory cells, a distribution of states 200 of memory cells may change or drift over time, as mentioned above and discussed in further detail below. Of course, such details describing a distribution of states are merely examples, and claimed subject matter is not so limited.

Figure 3:
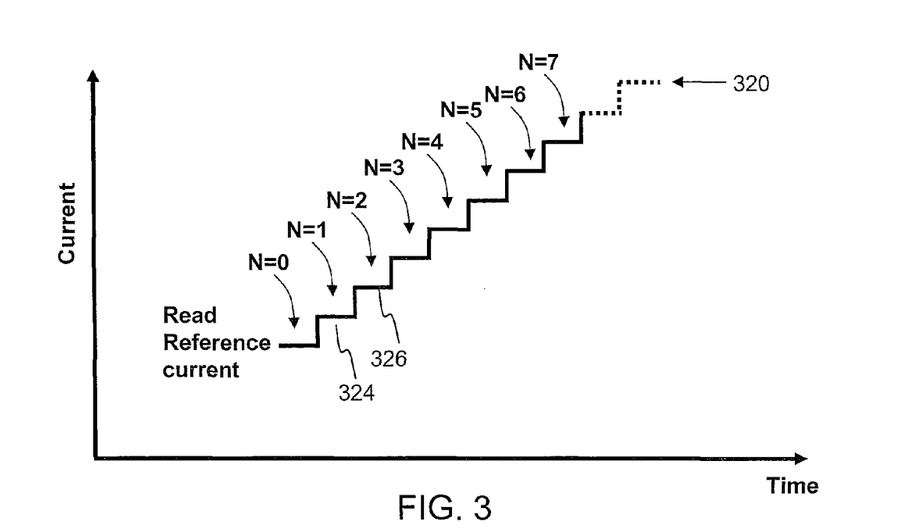
FIG. 3 is a plot of characteristics of reference current values, according to an embodiment.

FIG. 3 shows a plot of characteristics of scanned read-current values, according to an embodiment. Thus, returning to the example above, read current 324 of step N=1 may correspond to a read current of one micro-amp, read current 326 of step N=2 may correspond to a read current of two micro-amps, and so on. Of course, such particular values of read currents are merely examples, and claimed subject matter is not limited in this respect. Moreover, in an embodiment, values of individual read currents may be adjusted over time to compensate for memory cell parameters that may change over time. For example, such parameters may include threshold voltage for one or more particular states of memory cells, which may change as memory cell temperature changes.

Figure 4:
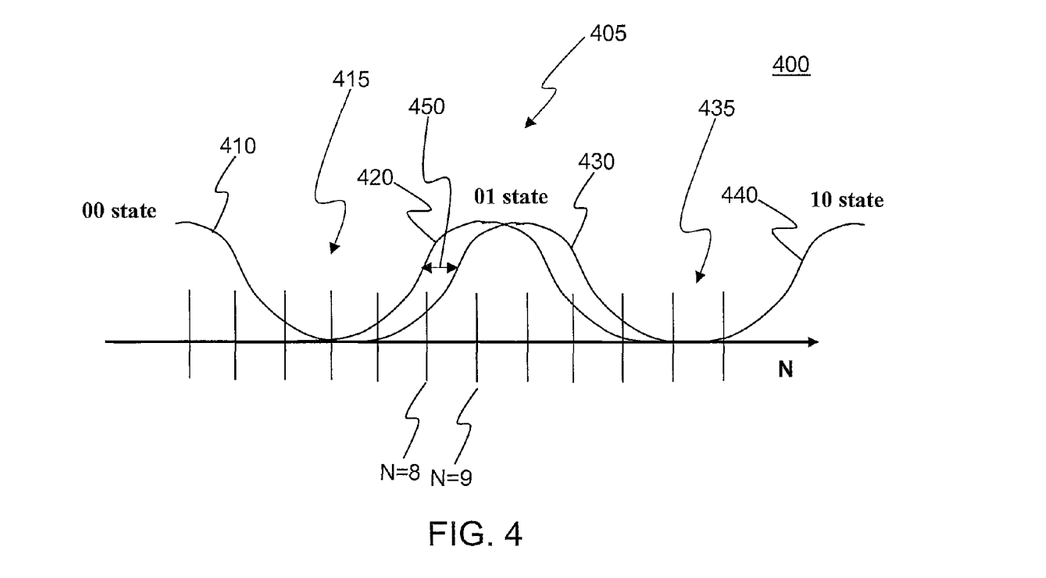
FIG. 4 is a plot showing a distribution of states of memory cells in a PCM, according to another embodiment.

FIG. 4 is a plot 400 showing a distribution of states 405 of PCM cells in a PCM device, according to another embodiment. In a particular example, plot 400 includes states "00", "01", and "10", wherein state "01" is shown to drift while states "00" and "10" remain substantially unchanged. Such drift may result from a change in temperature of the PCM device, for example. In one implementation, plot 400 may comprise a portion of plot 200 shown in FIG. 2. Distribution portion 410 may comprise a high-current tail-end of state "00", distribution portion 420 may comprise a low-current tail-end of state "01", distribution portion 430 may comprise a high-current tail-end of state "01", and distribution portion 440 may comprise a low-current tail-end of state "10", for example. State "00" and state "01" may be separated by window 415, and state "01" and state "10" may be separated by window 435. In an implementation, distribution of states 405 may change over time for any of a number of reasons. For example, PCM cells may comprise crystalline material that may drift towards higher resistivity, particularly if crystallization of the material is not complete, such as in PCM cells used in a multilevel application. On the other hand, PCM cells may comprise amorphous material that may evolve towards a crystalline state, thus affecting distribution of energy states. In addition, cycling through states of a PCM cell may also affect distribution of energy states. For example, state "01" may shift to a lower current value. In such a case, memory cells having state "01" corresponding to a read current step N=9 may subsequently have the memory state "01" corresponding to a read current step N=8 as a result of such a distribution shift. Of course, such values are merely examples, and claimed subject matter is not so limited.

In an implementation, distribution of states 405 may vary with time differently for one state compared to another state. For example, though state "01" may shift by an amount 450 to a lower current value, state "00" and state "10" may remain unchanged. As a result, window 415 may decrease, whereas window 435 may increase. Accordingly, modifying read currents of PCM cells for individual read current steps N may allow window 415 and/or window 435 to remain substantially constant despite a time-varying distribution of states.

Figure 5:
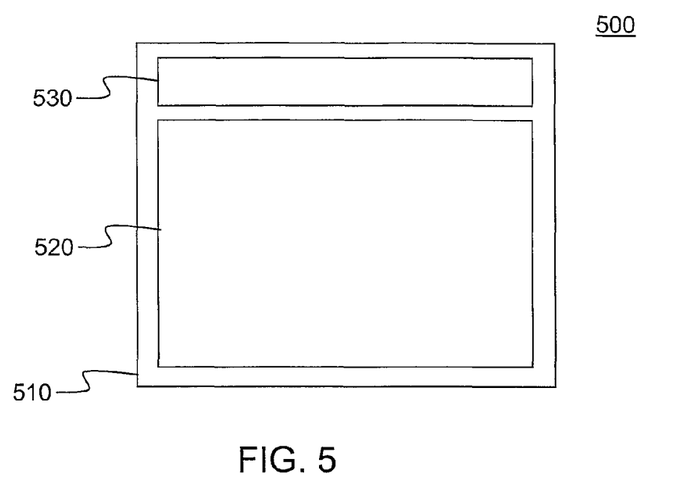
FIG. 5 is a schematic diagram illustrating a program buffer, according to an embodiment.

FIG. 5 is a schematic diagram illustrating a program buffer 510, according to an embodiment. Such a program buffer may comprise a memory array portion 520 and a reference portion 530. For example, memory array portion 520 may comprise PCM cells used as a memory buffer during a process of writing to another nonvolatile memory device, though claimed subject matter is not so limited. In another example, memory array portion 520 may comprise PCM to store information for an extended period of time, such as a few seconds or a few years. Reference portion 530 may comprise PCM cells to store one or more reference states programmed at the same time that memory array portion 520 is programmed. Such reference states, for example, may comprise a particular pattern of states. In one implementation, reference portion 530 may comprise a relatively small number of PCM cells compared to the number of PCM cells included in memory array portion 520. For example, reference portion 530 may comprise four PCM cells to store four reference states, whereas memory array portion 520 may comprise 256k or so PCM cells. Such reference states may comprise a known pattern of states programmed at the same time as programming information into memory array portion 520. Such a known pattern of reference states may allow for a technique to compensate for drifting or varying distribution of PCM cell states over time. Such a technique, for example, may take advantage of a fact that the same changes that occur to PCM cells of memory array portion 520 may also occur to reference cells of reference portion 530. Further, since reference cells of reference portion 530 may comprise a known pattern of states, a determination may be made as to the amount by which the distribution of PCM cell states of memory array portion 520 changed over time. Of course, such details of PCM reference cells and a memory array are merely examples, and claimed subject matter is not limited in this respect.

Figure 6:
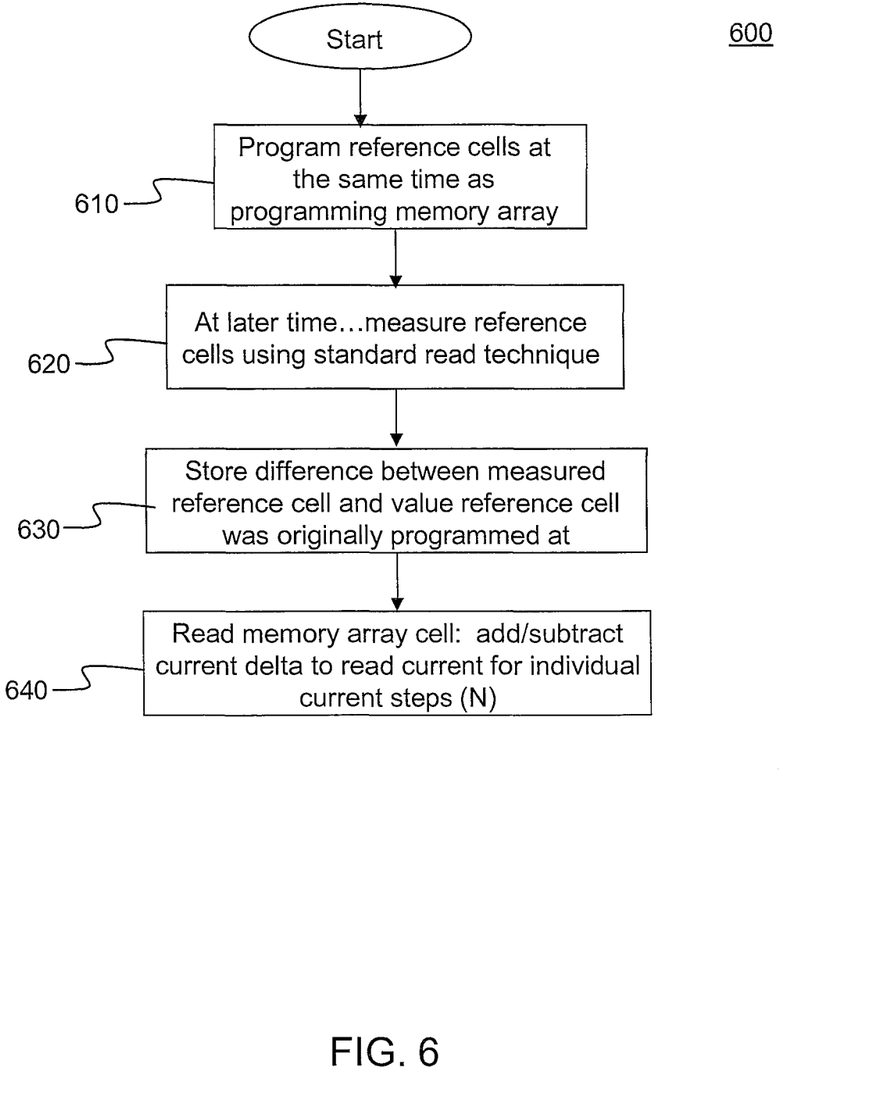
FIG. 6 is a flow diagram of a program/read process of a memory cell, according to an embodiment.

FIG. 6 is a flow diagram of a program/read process 600 of a PCM cell, according to an embodiment. At block 610, PCM reference cells comprising a known pattern of states may be programmed at the same time as programming a PCM array such as a program buffer. During a period between block 610 and block 620, a distribution of PCM cell states may change in substantially identical fashion for both PCM reference cells and PCM cells of the memory array. At block 620, such a change may be determined by measuring reference currents of PCM reference cells. For example, though a distribution of PCM reference cell states may have changed from the time the PCM reference cells were programmed, since such PCM reference cell states may be known a priori, the change in the distribution may be determined. In one implementation, the change in the distribution of reference cell states may be determined from the difference between the distribution of reference cell states at the time of programming and the present distribution of reference cell states. As explained in detail below, such differences may be evaluated for individual read-current steps N.

Continuing with process 600, at block 630, values of differences, or current deltas, between currently measured reference cell states and values at which reference cell states were originally programmed may be determined and stored. At block 640, such current deltas may be added or subtracted to/from read currents of PCM cells for individual read-current step numbers N. For example, differences between currently measured reference cell states and values at which reference cell states were originally programmed may be determined to be 100 nano-amps (nA) for N=2, 200 nA for N=3, zero for N=4 through 8, −200 nA for N=9, and so on. In one implementation, such current deltas may be stored in a memory and applied at a later time, for example. To illustrate a particular example, for a particular voltage applied to a PCM cell for step N=3, a resulting read current may be about 3.6 micro-amps. In accordance with a measured current delta of 200 nA for N=3, 200 nA may be subtracted from the read current of 3.6 micro-amps so that a modified read current equals 3.4 micro-amps. After such a subtraction, the decrease of the modified read current may compensate for the fact that reference currents, which may be used as state threshold values to which the modified read currents of PCM cells are compared, may have drifted or changed over time from their original values at program time. For example, the current threshold between a "00" state and a "01" state may be defined to be 3.5 micro-amps. With no read current compensation, a drift of state distribution over time may result in an erroneous shift of the memory cell from the "00" state (e.g., the memory cell read current originally being 3.4 micro-amps for N=3 at program time) to the "01" state (e.g., the memory cell read current presently being 3.6 micro-amps for N=3 after drift). On the other hand, compensating a memory cell read current using stored current deltas may result in a subtraction of 200 nA from the memory cell read current. Thus a modified read current may equal 3.4 micro-amps, which is within the range of the "00" state, so that a drifting state distribution did not lead to a changed stored state of the memory cell. Of course, such details of a process to compensate for a changing state distribution are merely examples, and claimed subject matter is not so limited.

Figure 7:
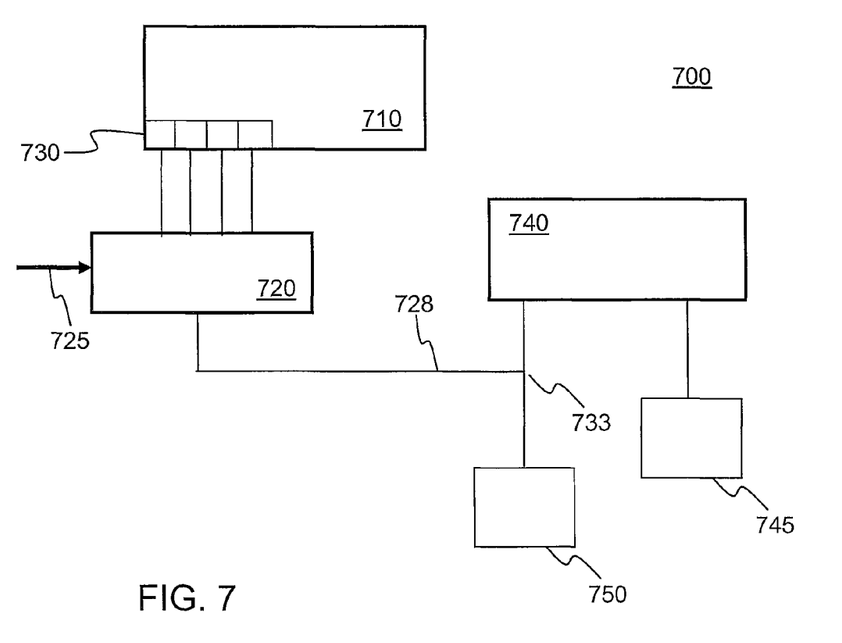
FIG. 7 is a schematic diagram illustrating a read-distribution management portion of a PCM device, according to an embodiment.

FIG. 7 is a schematic diagram illustrating a read-distribution management portion 700 of a PCM device, according to an embodiment. Read-distribution management portion 700, which may implement processes such as program/read process 600, for example, may comprise an array of PCM cells such as a page buffer 710 that includes a reference cell portion 730. Such a reference cell portion may be used to store reference cell states comprising a known pattern of states. As mentioned above, such reference cell states and the memory array may be programmed at the same time. Thus, during a time period from programming to a subsequent read process, a distribution of PCM cell states may change in substantially identical fashion for both reference PCM cells and PCM cells of a memory array. In block 720, read currents of reference PCM cells in the reference cell portion 730 may be measured at a later time and compared to known read currents 725 of the reference cells at the time the reference cells (and the memory array) were programmed. From such comparing, current deltas equal to the difference between presently measured read currents and known original read currents of the reference cells may be determined at block 720. For example, if program buffer 710 experienced no drift in the distribution of reference cell states then current deltas may equal zero. On the other hand, program buffer 710 experiencing drift in the distribution of reference cell states may result in nonzero current deltas.

Read-distribution management portion 700 may comprise analog sensor 740 to compare read currents of individual PCM cells to read reference currents provided by block 745. Values of such read reference currents may be sequentially stepped up during a process of reading individual PCM cells, wherein such steps may correspond to individual read-current step numbers N, as described above. Analog sensor 740 may determine states of individual PCM cells by comparing the memory cells' read currents with threshold values of read reference currents. A cell current during a read process may result by applying a voltage across a PCM cell so that the cell current during read may depend, at least in part, on a resistance of the PCM cell. Accordingly, the state of a PCM cell, e.g., its value of resistance, may be determined by comparing such a cell current during read to a read reference current value provided by block 745. In an implementation, such a read reference current value may be sequentially stepped up during a process of reading a PCM cell. In an implementation, block 720 may provide current deltas via line 728 to be combined with read currents of individual PCM cells at circuit node 733. By combining currents in such a fashion, read currents measured by analog sensor 740 may be modified to compensate for drift of state distribution of program buffer 710. For example, a negative current delta provided by block 720 for N=7 may result in analog sensor 740 measuring a reduced read current (e.g., a modified read current) of a memory cell for N=7. Consequently, analog sensor 740 may compare the reduced read current to a reference current for N=7 provided by block 745. Such a reduced read current may more accurately reflect the distribution of states of program buffer 710 upon comparison with reference currents. Of course, such details of read-distribution management are merely examples, and claimed subject matter is not limited in this respect.

Figure 8:
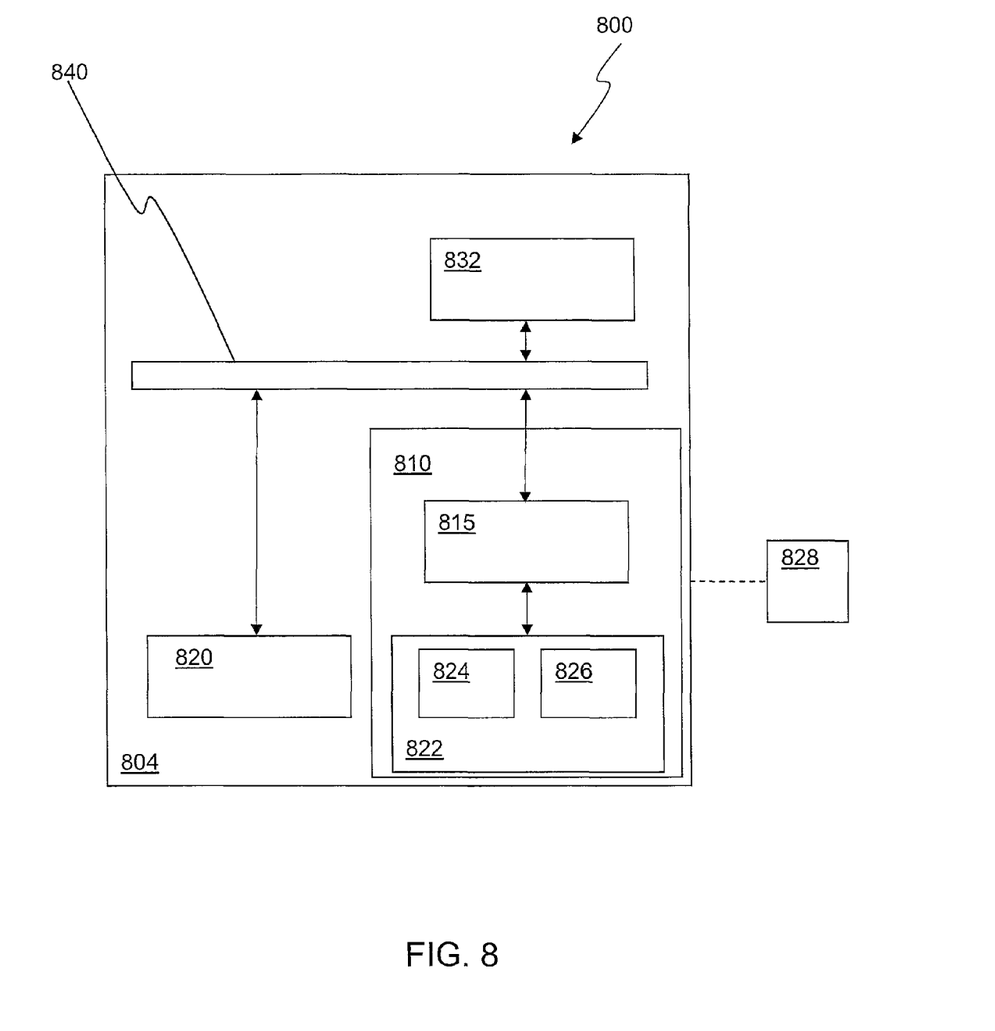
FIG. 8 is a schematic diagram illustrating an exemplary embodiment of a computing system.

FIG. 8 is a schematic diagram illustrating an exemplary embodiment of a computing system 800 including a memory device 810. Such a computing device may comprise one or more processors, for example, to execute an application and/or other code. For example, memory device 810 may comprise a PCM program buffer, such as program buffer 710 shown in FIG. 1. A computing device 804 may be representative of any device, appliance, or machine that may be configurable to manage memory device 810. Memory device 810 may include a memory controller 815 and a memory 822. By way of example but not limitation, computing device 804 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 800, and the processes and methods as further described herein, may be implemented using or otherwise including hardware, firmware, software, or any combination thereof. Thus, by way of example but not limitation, computing device 804 may include at least one processing unit 820 that is operatively coupled to memory 822 through a bus 840 and a host or memory controller 815. Processing unit 820 is representative of one or more circuits configurable to perform at least a portion of a data computing procedure or process. By way of example but not limitation, processing unit 820 may include one or more processors, controllers, microprocessors, microcontrollers, application specific integrated circuits, digital signal processors, programmable logic devices, field programmable gate arrays, and the like, or any combination thereof. Processing unit 820 may include an operating system configured to communicate with memory controller 815. Such an operating system may, for example, generate commands to be sent to memory controller 815 over bus 840. In one implementation, memory controller 815 may comprise an internal memory controller or an internal write state machine, wherein an external memory controller (not shown) may be external to memory device 810 and may act as an interface between the system processor and the memory itself, for example. Such commands may comprise read and/or write commands. In response to a write command, for example, memory controller 815 may provide a bias signal, such as bias signal 410 comprising a series of set pulses having individual peak amplitudes that sequentially decrease from one pulse to the next, shown in FIG. 4, for example. In particular, memory controller 815 may apply a first bias pulse to a PCM cell to attempt to place the PCM cell in a low-resistance state in response to a write command, measure a cell current during verify of the PCM cell, and apply a second bias pulse to the PCM cell to attempt to place the PCM cell in the low-resistance state, wherein the second bias pulse may include a peak amplitude that is less than that of the first bias pulse in response to a comparison of the cell current during verify with a first verify reference current value.

Memory 822 is representative of any data storage mechanism. Memory 822 may include, for example, a primary memory 824 and/or a secondary memory 826. Memory 822 may comprise PCM, for example. Primary memory 824 may include, for example, a random access memory, read only memory, etc. While illustrated in this example as being separate from processing unit 820, it should be understood that all or part of primary memory 824 may be provided within or otherwise co-located/coupled with processing unit 820.

In one embodiment, computing system 800 may comprise a program buffer including a PCM array and a PCM reference cell portion to store one or more particular reference states. System 800 may also include a controller to apply a bias pulse to a cell of the PCM array to produce a cell current in response to a read operation, and to modify the cell current based, at least in part, on a reference current resulting from the one or more particular reference states. System 800 may further include a processor to host one or more applications and to initiate the read operation.

Secondary memory 826 may include, for example, the same or similar type of memory as primary memory and/or one or more data storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 828. Computer-readable medium 828 may include, for example, any medium that can carry and/or make accessible data, code, and/or instructions for one or more of the devices in system 800.

Computing device 804 may include, for example, an input/output 832. Input/output 832 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 832 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method for reading a memory cell in a memory array, comprising:
providing an associated electrical measurement delta for each of a plurality of electrical measurement steps for determining a memory state of the memory cell, wherein the associated electrical measurement delta corresponds to a drift in a state distribution of the memory cell; and
determining the memory state by adjusting, with the associated electrical measurement delta, a comparison between an electrical read output of the memory cell and an electrical read output of a reference cell for each of the plurality of electrical measurement steps.

2. The method of claim 1, wherein the associated electrical measurement delta for each of the plurality of electrical measurement steps is configured to compensate for a physical change of the memory cell over a duration between a point in time and an earlier point in time.

3. The method of claim 1, wherein adjusting the comparison comprises subtracting the associated electrical measurement delta from the memory cell electrical read output.

4. The method of claim 1, further comprising retrieving the associated electrical measurement delta for each of the plurality of electrical measurement steps from a register prior to determining the memory state.

5. The method of claim 1, further comprising programming the memory cell, and programming the reference cell during programming the memory cell.

6. The method of claim 1, wherein determining the memory state further comprises sequentially stepping through the plurality of electrical measurement steps.

7. The method of claim 1, wherein the associated electrical measurement delta comprises a current delta, wherein the electrical read output of the memory cell comprises a memory cell current output, and wherein the electrical read output of the reference cell comprises a reference cell current output.

8. A memory device, comprising:
a memory cell and a reference cell in a memory array;
a memory controller configured to:
provide an associated electrical measurement delta for each of a plurality of electrical measurement steps for determining a memory state of the memory cell, wherein the associated electrical measurement delta corresponds to a drift in a state distribution of the memory cell; and
determine the memory state by adjusting, with the associated electrical measurement delta, a comparison between an electrical read output of the memory cell and an electrical read output of a reference cell for each of the plurality of electrical measurement steps.

9. The device of claim 8, further comprising a register configured to store the associated electrical measurement delta for each of the plurality of electrical measurement steps, and wherein the memory controller is configured to store the associated electrical measurement delta for each of the plurality of electrical measurement steps prior to performing a read operation of the memory cell.

10. The device of claim 9, wherein the register is stored in a nonvolatile memory.

11. The device of claim 8, wherein the memory controller is configured to determine the associated electrical measurement delta for each of the plurality of electrical measurement steps by measuring an electrical read output of the reference cell at a point in time and an electrical read output of the reference cell at an earlier point in time for each of the plurality of electrical measurement steps.

12. The device of claim 8, wherein the memory controller is configured to determine the associated electrical measurement delta for each of the plurality of electrical measurement steps during a read operation for reading the memory cell.

13. The device of claim 8, wherein the associated electrical measurement delta comprises a current delta, wherein the electrical read output of the memory cell comprises a memory cell current output, and wherein the electrical read output of the reference cell comprises a reference cell current output.

14. The device of claim 13, wherein the memory controller is configured to adjust the comparison by subtracting the associated electrical measurement delta from the electrical read output of the memory cell.

15. The device of claim 8, wherein the memory controller is configured to program the reference cell during programming of the memory cell.

16. The device of claim 8, further comprising a memory array error correction device, wherein adjusting the comparison is performed in response to an indication of a number of detected errors in the memory array exceeding a correction capacity of the memory array error correction device.

17. A system, comprising:
a memory cell and a reference cell in a memory array;
a memory controller configured to:
provide an associated electrical measurement delta for each of a plurality of electrical measurement steps for determining a memory state of the memory cell, wherein the associated electrical measurement delta corresponds to a drift in a state distribution of the memory cell; and
determine the memory state by adjusting, with the associated electrical measurement delta, a comparison between an electrical read output of the memory cell and an electrical read output of a reference cell for each of the plurality of electrical measurement steps; and
a processor configured to initiate at least one command to the memory controller for accessing the memory array.

18. The system of claim 17, wherein the memory controller is configured to adjust the comparison by subtracting the associated electrical measurement delta from the electrical read output of the memory cell.

19. The system of claim 17, wherein the memory controller is configured to determine the associated electrical measurement delta for each of the plurality of electrical measurement steps by measuring an electrical read output of the reference cell at a point in time and an electrical read output of the reference cell at an earlier point in time for each of the plurality of electrical measurement steps.

20. The system of claim 17, wherein the memory controller is configured to store the associated electrical measurement delta for each of the plurality of electrical measurement steps prior to initiating a read operation for reading the memory cell.

21. The system of claim 17, wherein the memory cell and the reference cell both comprise phase change memory (PCM).

* * * * *